United States Patent
Rennon et al.

(10) Patent No.: US 8,693,098 B2
(45) Date of Patent: Apr. 8, 2014

(54) PROJECTION OBJECTIVE FOR A MICROLITHOGRAPHIC EUV PROJECTION EXPOSURE APPARATUS

(75) Inventors: Siegfried Rennon, Wuerzburg (DE); Hans-Juergen Mann, Oberkochen (DE); Thomas Schicketanz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 493 days.

(21) Appl. No.: 12/904,513

(22) Filed: Oct. 14, 2010

(65) Prior Publication Data
US 2011/0090559 A1  Apr. 21, 2011

(30) Foreign Application Priority Data
Oct. 15, 2009  (DE) .......................... 10 2009 049 640

(51) Int. Cl.
  *G02B 5/08*  (2006.01)
  *G02B 1/10*  (2006.01)
  *G02B 5/00*  (2006.01)
(52) U.S. Cl.
  CPC  *G02B 5/085* (2013.01); *G02B 5/08* (2013.01); *G02B 1/10* (2013.01); *G02B 5/00* (2013.01)
  USPC ............................ 359/584; 359/359; 359/848
(58) Field of Classification Search
  USPC ................ 359/350–361, 850–861, 838, 883, 359/584–587
  See application file for complete search history.

(56) References Cited

U.S. PATENT DOCUMENTS

| | | | |
|---|---|---|---|
| 6,453,005 | B2 | 9/2002 | Kaiser |
| 7,477,355 | B2 | 1/2009 | Fehr et al. |
| 7,557,902 | B2 | 7/2009 | Dinger et al. |
| 2003/0128810 | A1* | 7/2003 | Verman et al. ................... 378/84 |
| 2007/0035814 | A1* | 2/2007 | Dinger et al. .................. 359/350 |
| 2012/0212810 | A1 | 8/2012 | Paul et al. |

FOREIGN PATENT DOCUMENTS

| | | |
|---|---|---|
| DE | 102009 032 779.7 | 1/2011 |
| WO | WO 2006/069725 | 7/2006 |
| WO | WO 2011/003676 | 1/2011 |

OTHER PUBLICATIONS

M. Davis et. al., "Compaction effects of radiation on Zerodur®", Proceedings of the SPIE, vol. 5179, pp. 38-49 (2003).
P. L. Hegby et al., "Radiation Effects on the Physical Properties of Low-Expansion-Coefficient Glasses and Ceramics", J. Am. Ceram. Soc., vol. 71 No. 9 (1988), pp. 796-802.
P. Z. Takacs et al., "X-Ray Induced Damage Observations in Zerodur Mirrors", Proc. SPIE 3152 (1997), pp. 1-9.

* cited by examiner

*Primary Examiner* — Thong Nguyen
(74) *Attorney, Agent, or Firm* — Fish & Richardson P.C.

(57) ABSTRACT

A projection objective for a microlithographic EUV projection exposure apparatus includes a first mirror and a second mirror. The first mirror includes a mirror substrate and a reflective coating carried by the mirror substrate. The second mirror includes a mirror substrate and a reflective coating carried by the mirror substrate. The first and second mirrors are configured so that, with otherwise equal irradiation by EUV light, the mirror substrate of the first mirror compacts less than the mirror substrate of the second mirror under the effect of the EUV light.

14 Claims, 3 Drawing Sheets

PROJECTION OBJECTIVE FOR A MICROLITHOGRAPHIC EUV PROJECTION EXPOSURE APPARATUS

CROSS-REFERENCE TO RELATED APPLICATIONS

This applications claims priority under 35 U.S.C. §119 to German Patent Application DE 10 2009 049 640.8, filed Oct. 15, 2009. The contents of this application is hereby incorporated by reference in its entirety.

FIELD

The disclosure relates to a projection objective for a microlithographic EUV projection exposure apparatus, having a first mirror and having a second mirror, the first and second mirrors respectively including a mirror substrate and a reflective coating carried by the latter.

BACKGROUND

Microlithographic projection exposure apparatus are used in order to transfer structures, which are contained in a mask, onto a photoresist or another photosensitive layer. Important optical components of a projection exposure apparatus include a light source, the illumination system which conditions the projection light generated by the light source and directs it onto the mask, and the projection objective which images the mask illuminated by the illumination system onto the photosensitive layer.

When the wavelength of the projection light is shorter, commensurately smaller structures can be defined on the photosensitive layer with the aid of the projection exposure apparatus. It is believed that the next generation of projection exposure apparatus will use projection light in the extreme ultraviolet spectral range (EUV), the wavelength of which is at 13.5 nm. Such projection exposure apparatus are often referred to as EUV projection exposure apparatus.

However, it is believed that there may be no optical materials which have a sufficiently high transmissivity for such short wavelengths. EUV projection exposure apparatus therefore exclusively contain reflective optical elements, and the mask therefore also contains a pattern of reflective structures. The provision of mirrors for EUV projection exposure apparatus, however, represents a great technological challenge. Coatings which are suitable for EUV light, and are applied onto a mirror substrate, often include more than 30 or 40 double layers with a thickness of only a few nanometers, which are vapour deposited over one another in technologically elaborate processes. Even with such elaborately constructed coatings, the reflectivity of the mirrors for EUV light is usually scarcely more than 70%, this being only for light which strikes the reflective coating perpendicularly or with incidence angles of a few degrees.

The comparatively low reflectivity of the mirrors means that attempts have been made to use as few mirrors as possible when developing projection exposure apparatus, since each mirror involves light losses and in the end reduces the throughput of the projection exposure apparatus. The relatively low reflectivity of the mirrors, however, also entails thermal problems since the fraction of the energetic EUV light not reflected by the coating is often absorbed and can lead to a temperature increase of the mirrors. The heat thereby generated is to be dissipated essentially via thermal conduction through the mirror substrate, since the projection exposure apparatus have to be operated in a vacuum owing to the high absorption of EUV light by gases.

Materials which have a thermal expansion coefficient that is very small are often used for the mirror substrates to reduce temperature gradients occurring in the mirror substrates that could lead to undesired deformation of the mirrors. Such glass-based materials are marketed, for example, by Schott under the brand Zerodur® and by Corning under the brand ULE®. By additional measures, thermal deformations which are caused by absorption of EUV light can be kept small, or at least their effects on the optical properties of the projection objective are kept within tolerable limits.

As an example, U.S. Pat. No. 7,477,355 B2 proposes to heat the mirrors using an additional heating mechanism so that their substrate material is at a temperature at which the thermal expansion coefficient is zero or at least a minimal. It is reported that temperature variations during operation of the apparatus then have no effect, or only little effect, on the imaging properties of the mirror.

U.S. Pat. No. 7,557,902 B2 describes a projection objective in which two mirrors contain materials whose thermal expansion coefficient increases with increasing temperature for one of the two mirrors and decreases with increasing temperature for the other mirror. It is disclosed that, with suitable selection of the mirrors, the effect which can be achieved in this way is that although the two mirrors deform significantly in the event of a temperature change, the optical effects of these deformations nevertheless substantially cancel each other out.

SUMMARY

The disclosure provides a projection objective for an EUV projection exposure apparatus, where the imaging quality is preserved over long operating times.

In some embodiments, a projection objective for a microlithographic EUV projection exposure apparatus includes a first mirror and a second mirror. The first mirror includes a mirror substrate and a reflective coating carried by the mirror substrate. The second mirror includes a mirror substrate and a reflective coating carried by the mirror substrate. The first mirror and the second mirror are configured so that, with otherwise equal irradiation by EUV light, the mirror substrate of the first mirror compacts less than the mirror substrate of the second mirror under the effect of the EUV light.

In this context, "otherwise equal conditions" means that the mirrors to be compared are exposed to the same light with the same intensity over the same period of time. Such "otherwise equal conditions" therefore essentially exist only in the laboratory but never in a projection objective, because there each mirror is exposed to different irradiation by the EUV light.

The disclosure is based on the surprising discovery that for the materials with a small thermal expansion coefficients, which have hitherto been favoured for mirror substrates, irreversible degradation processes take place when these materials are exposed to energetic EUV light for a prolonged time. Specifically, these degradation processes are material modifications which can also be observed similarly in quartz glass lenses, when very intense longer-wavelength light passes through them. This type of material modification, which is usually referred to as compaction, occurs because the highly energetic light causes breaking and rearrangement of molecular bonds, associated with which there is a volume reduction. In the case of quartz glass lenses, compaction generally leads to a change in the refractive index and often also to deformation of the lens. The compaction generally becomes significant only when the energy density of the light in the material exceeds a particular limit value over for a prolonged time.

Surprisingly, the compaction observed in glass-based mirror substrates is in fact less because the reflective coating carried by the mirror substrates absorbs the nonreflected component of the EUV light almost completely, so that this component cannot actually penetrate into the mirror substrate. As shown by more detailed analyses, however, this evidently applies exactly only for the operating wavelength for which the coating is configured. The radiation sources typically used, in particular laser induced plasma sources, do however generate EUV light with a bandwidth which is centred in a Gaussian fashion on the operating wavelength. The full width at half maximum (FWHM) of this approximately Gaussian spectral distribution amounts to about 1%, so that the majority of the EUV light is emitted with wavelengths between about 13.36 nm and 13.64 nm. As mentioned, however, the coating is substantially nontransmissive only for the operating wavelength of 13.5 nm. The more the wavelength of the light differs from the operating wavelength, the greater is the component of the light which can pass through the reflective coating and therefore enter the mirror substrate. Evidently, it is these light components which cause the observed compaction of glass-based mirror substrates.

Since Zerodur® and similar materials with low thermal expansion coefficients are often also used as substrates for mirrors which are intended for use in space, the question of the extent to which cosmic particle radiation could lead to compaction or other undesired modification of these materials has already been addressed for a long time. In this context, reference is made to the articles by M. Davis et. al. entitled "Compaction effects of radiation on Zerodur®", Proceedings of the SPIE, volume 5179, pages 38-49 (2003) and by P. L. Hegby et al. entitled "Radiation Effects on the Physical Properties of Low-Expansion-Coefficient Glasses and Ceramics", J. Am. Ceram. Soc., Vol. 71 No. 9 (1988), pages 796 to 802.

For electromagnetic radiation, as far as is known, there is only a study by P. Z. Takacs et al. entitled "X-Ray Induced Damage Observations in Zerodur Mirrors", Proc. SPIE 3152 (1997), pages 77 to 85. Compaction of Zerodur® was observed therein, but only for relatively hard X-radiation with an energy of more than 20 keV which corresponds to a wavelength of about 0.06 nm.

For EUV light, which is lower in energy by a factor of approximately 200, similar material modifications were not immediately to be expected.

According to the disclosure, however, the discovery that glass-based materials with low thermal expansion coefficients can be compacted under the longer-acting influence of EUV light should not lead to these materials being entirely prohibited from EUV projection objectives. This is because these materials have otherwise outstanding properties and ought therefore to be used as far as possible as mirror substrates in EUV projection objectives. According to the disclosure, additional measures which will be explained in more detail below, and which may involve for example using another material for the mirror substrates, are used only for a few selected mirrors. These selected mirrors are distinguished in that the intensity of the EUV light on their surfaces is so great that, without these additional measures, an intolerable degradation of the imaging properties would occur during the lifetime of the projection objective.

It is therefore expedient to divide the mirrors of the projection objective into first mirrors, for which particularly high intensities occur and whose mirror substrates are therefore less susceptible to compaction by EUV light than second mirrors, for which the intensities occurring are lower and whose mirror substrates can therefore be more susceptible to compaction by EUV light than the mirror substrates of the first mirrors.

The intensity of the EUV light striking a mirror depends, among other things, on the average subaperture diameter which occurs on the mirror in question, and on its position inside the projection objective. The subaperture diameter describes, simply speaking, the diameter of a light bundle which comes from a particular point of the object plane of the projection objective and which finally converges at a conjugate point in the image plane of the objective. The diameter of such a light bundle generally changes progressively when following the beam path in the projection objective. If a particular mirror is considered and the arithmetic mean is calculated for the subaperture diameters of all the field points, then the average subaperture diameter for the mirror in question is obtained. The smaller the subaperture diameter is, in general, the greater is the intensity of the EUV light on the mirror in question. This can easily be explained clearly by the fact that, in this case, the energy carried in the individual light bundles is concentrated on a smaller area. Since the subapertures of the individual field points overlap more or less according to the position of the mirror inside the projection objective, the average subaperture diameter represents a suitable measure of the intensity of the EUV light striking the mirror in question.

Since on the other hand, as already mentioned above, each mirror reflects only about a 70% fraction of the light with an operating wavelength of 13.5 nm, the intensity decreases perceptibly after each reflection at a preceding mirror. Overall, therefore, very much less EUV light strikes the last mirror of the projection objective than the first mirror.

Since conventionally the subaperture diameter also tends to increase rather than decrease in the light propagation direction, it is more the case that the front mirrors in the projection objective have the greater risk of compaction of the mirror substrate. In one exemplary embodiment, the projection objective therefore contains at least 4 mirrors arranged successively in the light propagation direction, at least one mirror of the first three mirrors in the light propagation direction and at least one mirror of the last three mirrors in the light propagation direction being a second mirror.

If it is assumed that a total of M mirrors are arranged successively in the projection objective, of which m mirrors are first mirrors and n=M−m are second mirrors, then division into first and second mirrors can be calculated as follows: for the m first mirrors:

$$SA_i < k \cdot 0.6^{(i-1)/2} \text{ and}$$

for the n second mirrors:

$$SA_i \geq k \cdot 0.6^{(i-1)/2}$$

Here, $SA_i$ is the average subaperture diameter for the $i^{th}$ mirror $M_i$ and k is a threshold value factor of between 50 mm and 200 mm, which is set as a function of the strength of an EUV light source of the projection exposure apparatus.

A projection objective in which the division of the total of M mirrors into first and second mirrors is set according to the inequalities above has outstanding long-term stability, and for as many mirrors as possible it is not necessary to implement any measures which prevent or sufficiently delay compaction.

The factor of $0.6^{(i-1)/2}$ expresses the dependency of the intensity on the position inside the projection objective. This factor does not use the maximum achieved reflectivity of about 70% for the operating wavelength since, as already mentioned above, precisely for the wavelengths which lie away from the operating wavelength and essentially cause the compaction, the reflectivity of the coating is less and is usually about 60%.

The threshold value factor k is to be set commensurately higher when the light entering the EUV projection objective is more intense and when the lifetime of the projection objective is made longer. Calculations show that, in many cases, a threshold value factor of between 80 and 150 leads to well-balanced results.

Measures will be explained below, by which the susceptibility of the mirror substrate of the first mirror to compaction can be reduced.

One possibility involves selecting, for the mirror substrate of the first mirror, a material which with otherwise equal irradiation by EUV light compacts less under the effect of the EUV light than a second material, of which the mirror substrate of the second mirror is made. In this case it is therefore permitted that energetic EUV light can penetrate into the mirror substrate, but this is made of a material which does not compact or compacts only weakly. Noncompacting materials, which are suitable for the mirror substrate of the first mirror, include silicon, silicon carbide, SiSiC, metals or metal alloys. These materials have already been proposed in U.S. Pat. No. 6,453,005 B2 for all the mirror substrates of an EUV projection objective.

These noncompacting materials, however, also have some disadvantages. For example, they polish less well than materials based on quartz glass. In order to improve the polishability, the aforementioned U.S. Pat. No. 6,453,005 B2 therefore proposes to arrange an additional layer of amorphous quartz ($SiO_2$) or aluminium oxide ($Al_2O_3$) between the mirror substrate and the reflective coating.

Furthermore, these noncompacting materials have relatively high thermal expansion coefficients, so that the heating during operation of the projection exposure apparatus can lead to deformations if suitable countermeasures are not implemented. These countermeasures may, in particular, involve cooling systems for the mirrors in question. It is, however, also feasible to allow the deformation of the mirrors in question and to correct the imaging errors resulting therefrom in another way. If the mirror in question is arranged in or in the vicinity of a pupil plane of the projection objective, for example, then deformations can be compensated for relatively well if another mirror, which is likewise arranged in or in the vicinity of a pupil plane, is configured as an adaptive mirror.

Another measure, by which a lower susceptibility of the mirror substrate of the first mirror to compaction by EUV light can be achieved, involves protecting the mirror substrate against irradiation by EUV light so that EUV light cannot actually penetrate into the mirror substrate. To this end only the first mirrors, but not the second mirrors, have a protective layer, the transmissivity of which for EUV light is less than 50% (e.g., less than 10%, less than 1%) arranged between the mirror substrate and the reflective coating.

Such a protective layer, which may include for example of a metal or a metal alloy and, for example, having a thickness of more than 20 nm, is thus to be configured so that high energy densities which would lead to compaction after some time cannot occur in the material of the mirror substrate. This measure therefore likewise achieves the effect that, with otherwise equal irradiation by EUV light, the mirror substrate of the first mirror compacts less under the effect of the EUV light than the mirror substrate of the second mirror.

Such protective layers are described in a patent application entitled "Spiegel für den EUV-Wellenlängenbereich, Projektionsobjektiv für die Mikrolithographie mit einem solchen Spiegel and Projektionsbelichtungsanlage für die Mikrolithographie mit einem solchen Projektionsobjektiv" [Mirrors for the EUV wavelength range, projection objective for microlithography having such a mirror, and projection exposure apparatus for microlithography having such a projection objective], which was filed by the Applicant on Oct. 7, 2009, under the application number DE 10 2009 032 779.7 at the German Patent and Trademark Office.

If the projection objective contains a plurality of first mirrors, then of course various measures for the first mirrors may be resorted to in order to reduce the susceptibility to compaction.

BRIEF DESCRIPTION OF THE DRAWINGS

Other features and advantages of the disclosure may be found in the following description of an exemplary embodiment with the aid of the drawings, in which.

DESCRIPTION OF PREFERRED EXEMPLARY EMBODIMENTS

Figure 1:
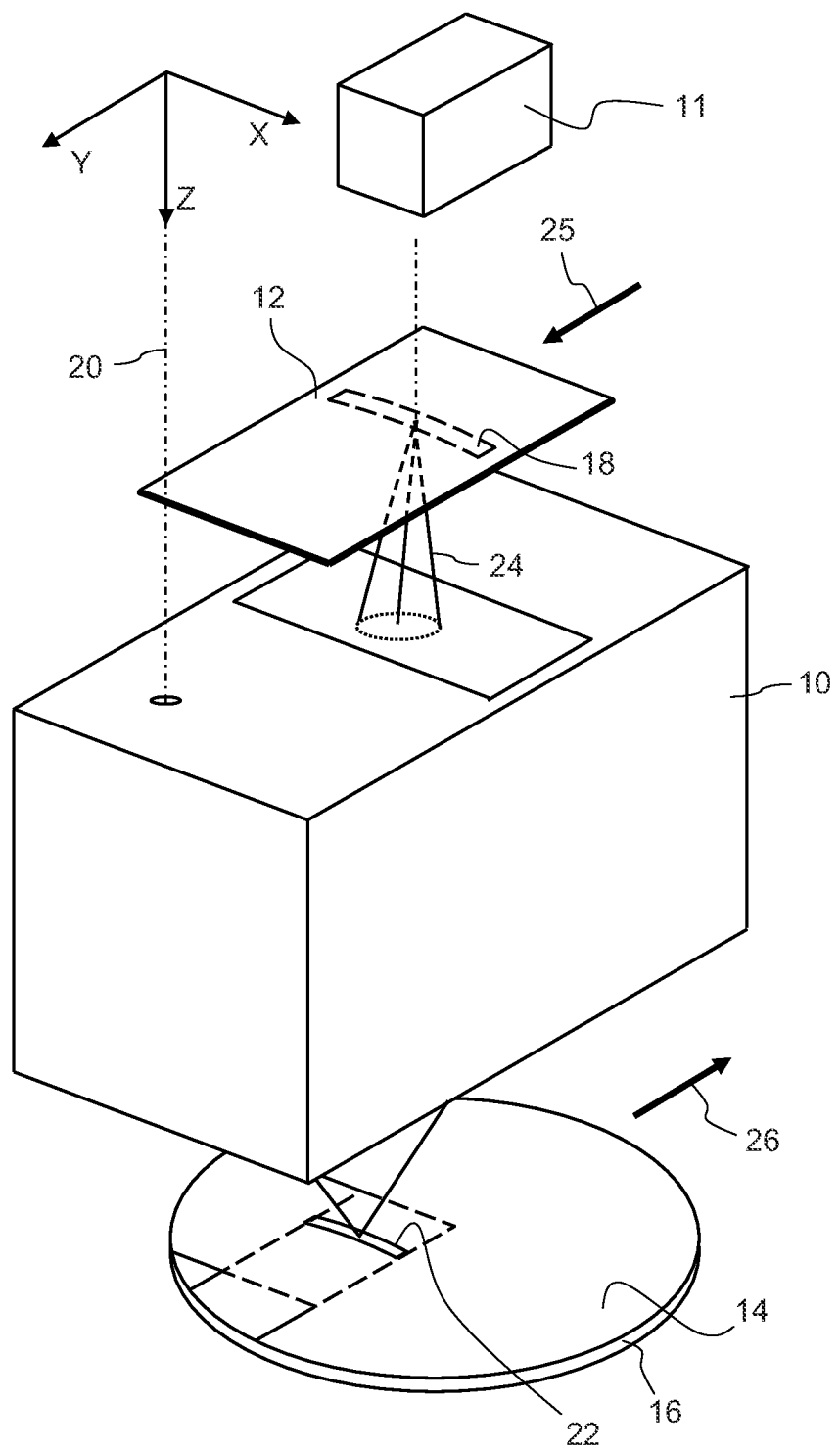
FIG. 1 shows a projection objective of a microlithographic EUV projection exposure apparatus, which images a mask onto a photosensitive layer, in a schematic perspective representation.

FIG. 1 schematically represents a projection objective of a microlithographic EUV projection exposure apparatus, denoted overall by 10, as a cuboid housing. The projection objective 10 is used to transfer reflective structures, which are arranged on a mask 12, onto a photosensitive layer 14. The photosensitive layer, which is usually a photoresist, is located on a wafer 16 or another substrate.

In order to transfer the structures onto the photosensitive layer, the mask 12 is illuminated with EUV light by an illumination system 11, the central wavelength of which in the exemplary embodiment represented is 13.5 nm and which has a spectral full width at half maximum of about 1%, so that the majority of the EUV light has wavelengths of between 13.36 nm and 13.64 nm. The illumination system 11 illuminates a field 18, which has the geometry of a ring segment in the exemplary embodiment represented, on the lower side of the mask 12. The symmetry axis of this ring segment coincides with an optical axis 20 of the projection objective 10, with respect to which the mirrors contained in the projection objective 10 are axisymmetric (except for recesses and holes).

Those reflective structures which lie inside the illuminated field 18 are imaged by the projection objective 10 onto the photosensitive layer 14 at a given time. In the exemplary embodiment represented, the projection objective 10 produces a reduced image 22 of the structures which are illuminated in the field 18 on the mask 12.

From each point in the illuminated field 18, which lies in an object plane of the projection objective 10, light bundles emerge and pass through the projection objective 10. These light bundles converge on conjugate field points in an image plane of the projection objective 10, in which the photosensitive layer 14 is arranged. For an individual point in the middle of the illuminated field 18, such a light bundle is indicated schematically and denoted by 24. The aperture angle of the light bundle 24 when it enters the projection objective 10 is a measure of its numerical aperture NA. Owing to the reduced imaging, the numerical aperture NA on the image side of the projection objective 10 is increased by the inverse of the imaging scale.

The projection objective 10 is configured for scanning operation, in which the mask 12 is displaced synchronously with the wafer 16 during the exposure of the photosensitive layer 14. These displacement movements of the mask 12 and the wafer 16 are indicated by arrows 25, 26 in FIG. 1; the speeds, with which the mask 12 and the wafer 16 are displaced, are in this case dictated by the imaging scale of the projection objective 10. During an exposure, the illuminated field 18 thus sweeps over the mask 12 in the manner of a scanning process so that even sizeable continuous structure regions can be transferred onto the photosensitive layer 14.

Figure 2:
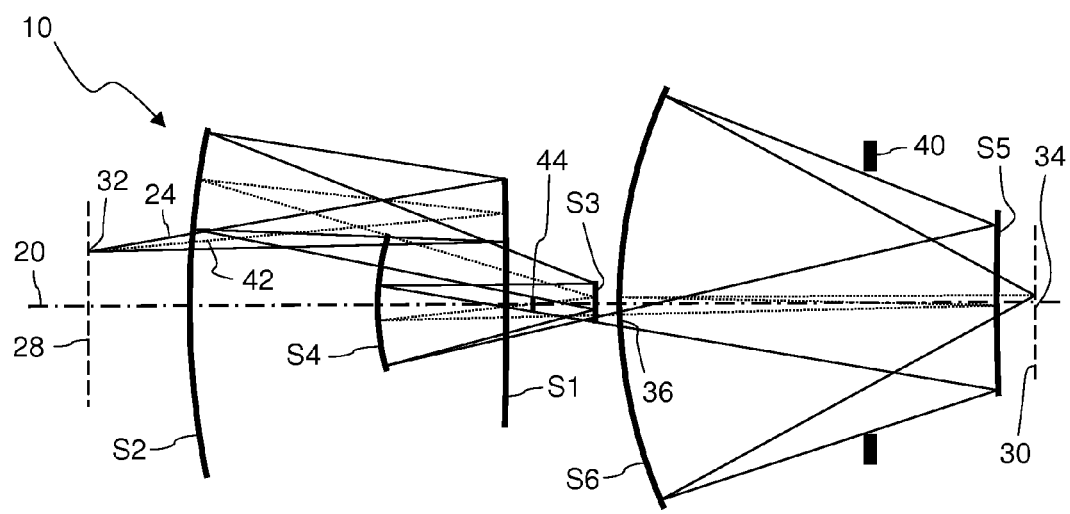
FIG. 2 shows a meridian section through the optical components of the projection objective shown in FIG. 1.

In FIG. 2, important optical components of the projection objective 10 are shown in a meridian section. Between the object plane indicated at 28 and the image plane indicated at 30, a total of 6 mirrors S1 to S6 are arranged along the optical axis 20. An EUV light bundle 24 coming from a point 32 in the object plane 28 first strikes the concave first mirror S1, is reflected back onto the concave second mirror S2, strikes the convex third mirror S3, is reflected back onto the concave fourth mirror S4 and then strikes the convex fifth mirror S5, which directs the EUV light back onto the concave sixth mirror S6. The latter focuses the EUV light bundle 24 at a conjugate image point 34 in the image plane 30.

In FIG. 2, the mirrors S1 to S6 are represented as full axisymmetric mirrors. As may readily be seen, the beam path described above cannot be achieved with such full mirrors since the mirrors S1 to S6 partially block the light path. For this reason, only those parts of the mirrors S1 to S6 which the EUV light strikes are actually present in the projection objective 10. One specific feature is found in the sixth mirror S6 since, in the proximity of the optical axis 20, it has an opening 36 via which the EUV light reflected by the fourth mirror S4 can pass through the sixth mirror S6 and strike the fifth mirror S5.

The projection objective 10 has an aperture stop 40, which is arranged in a pupil plane that lies between the fifth mirror S5 and the sixth mirror S6. A pupil plane is distinguished in that the principal ray of the light bundle 24, indicated by 42 and represented by dots, intersects the optical axis 20 there. Arranged in a further pupil plane, there is a shadowing stop 44 which causes defined shadowing of the pupil in the region which corresponds to the opening 36 in the sixth mirror S6. Field-independent shadowing is achieved in this way.

To this extent, the projection objective 10 corresponds to the projection objective which is shown in FIG. 7 of WO 2006/069725 in the name of the Applicant. Further details of the projection objective 10, including the optical data such as radii, distances and aspherical constants, may be found in the description for the exemplary embodiment represented in this figure.

In contrast to this known projection objective, however, in the projection objective 10 shown in FIG. 2 the mirrors S1 and S3 are constructed differently from the other mirrors S2 and S4 to S6.

Figure 3:
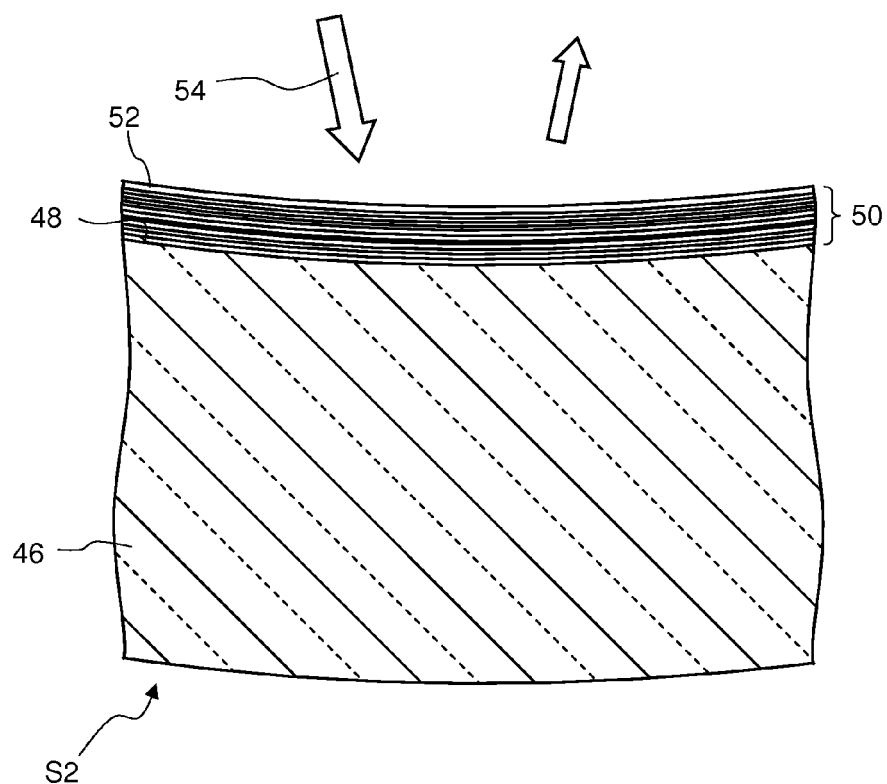
FIG. 3 shows a section through one of the mirrors of the projection objective shown in FIGS. 1 and 2.

The structure of these other mirrors S2 and S4 to S6 will first be explained below with reference to the example of the mirror S2 with the aid of the section partially shown in FIG. 3. The mirror S2 has a mirror substrate 46, which in the exemplary embodiment represented contains Zerodur®. This is a material based on quartz glass which, at the temperature subsequently set up during operation of the projection exposure apparatus, has a thermal expansion coefficient which is very low or even vanishingly small. If minor temperature variations take place around this operating temperature, then the mirror substrate 46 therefore does not change its shape, or does so only slightly.

A reflective coating 50, which includes a multiplicity of thin double layers 52, is applied on a polished surface 48 of the mirror substrate 46. The thickness, the materials and the sequence of the double layers 52 are selected so that as high as possible a fraction of the EUV light 54 striking the coating is reflected. For an operating wavelength of 13.5 nm, this reflected light fraction is about 70%. The nonreflected component of the EUV light with the operating wavelength 13.5 nm is almost completely absorbed by the coating 50 and converted into heat. This heat is dissipated into the mirror substrate 46 where it leads to a temperature increase which, however, as explained above, causes no deformation or only slight deformation of the mirror substrate 46.

It has, however, been found that a certain percentage of EUV light outside the operating wavelength passes through the reflective coating 50 and penetrates into the glass-based mirror substrate 46. There, the EUV light can cause compaction of the material which usually leads to a surface deformation of the mirror substrate that degrades the imaging properties. Studies have revealed that the surface deformation of the mirror substrate 46 (measured in nm) is approximately proportional to the square root of the cumulative energy density developed in the course of time. Especially for typical reflective coatings 50 having for example 40 double layers of molybdenum and silicon and a laser induced plasma source, a proportionality factor which amounts to about 0.25 is found between the surface deformation and the square root of the cumulative energy density. It can be deduced from this that a maximum permissible surface deformation of for example 0.1 nm for the mirror substrate 46 will not be exceeded if the total dose remains below 0.16 J/mm$^2$ throughout the entire lifetime of the projection objective 10. This is the case for the mirrors S2 and S4 to S6, for which reason possible surface deformations due to compaction of the surface substrate 46 can be tolerated.

For the mirrors S1 and S3, on the other hand, the total dose during the lifetime would lie above the limit value of 0.16 J/mm$^2$ specified above. For this reason, the compaction of the mirror substrate for these mirrors would be so great that the concomitant surface deformations would probably no longer be tolerable.

In order to prevent an intolerable surface deformation due to compaction, the first mirror S1 and the third mirror S3 of the projection objective 10 are constructed differently.

Figure 4:
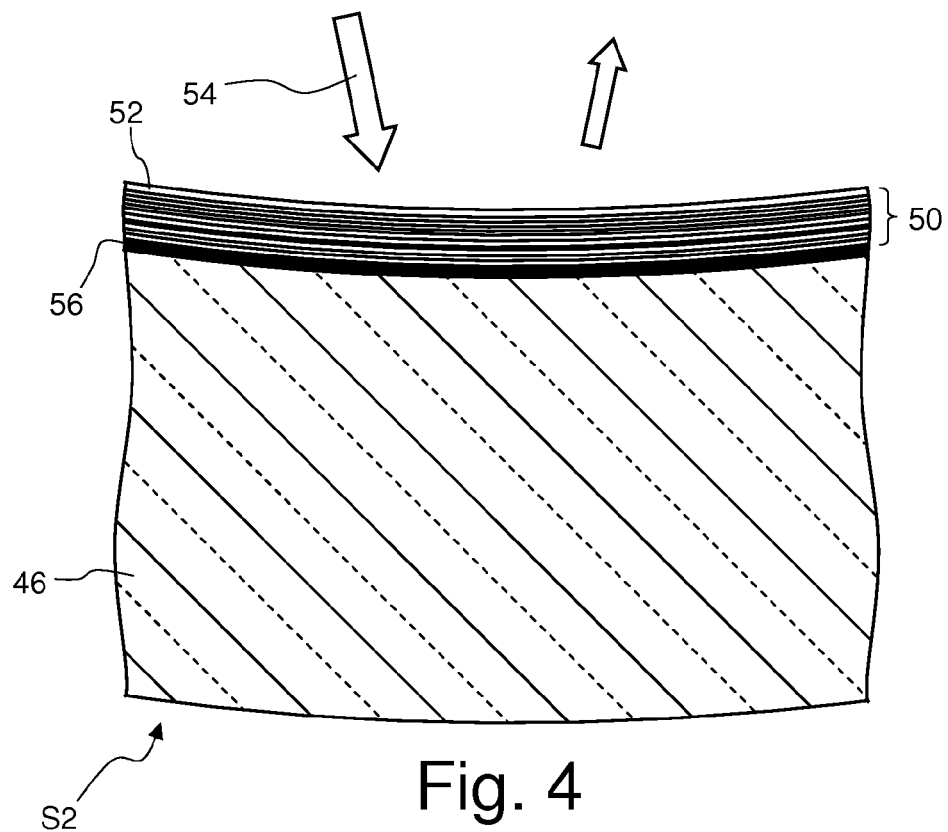
FIG. 4 shows a section through another mirror of the projection objective shown in FIGS. 1 and 2 according to a first exemplary embodiment.

A possible structure for these two mirrors S1 and S3 is shown in FIG. 4. In this exemplary embodiment, the basic structure corresponds precisely to that described above with reference to FIG. 3 for the mirrors S2 and S4 to S6. In contrast thereto, however, a protective layer 56 which absorbs the incident EUV light almost entirely is arranged between the mirror substrate 46 and the reflective coating 50. In the exemplary embodiment represented, the protective layer 56 is made of a metal or a metal alloy and has a thickness of 50 nm. Owing to the absorbent protective layer 56, no EUV light 54 or at most a negligible part of it can penetrate into the mirror substrate 46 and cause compaction there.

Figure 5:
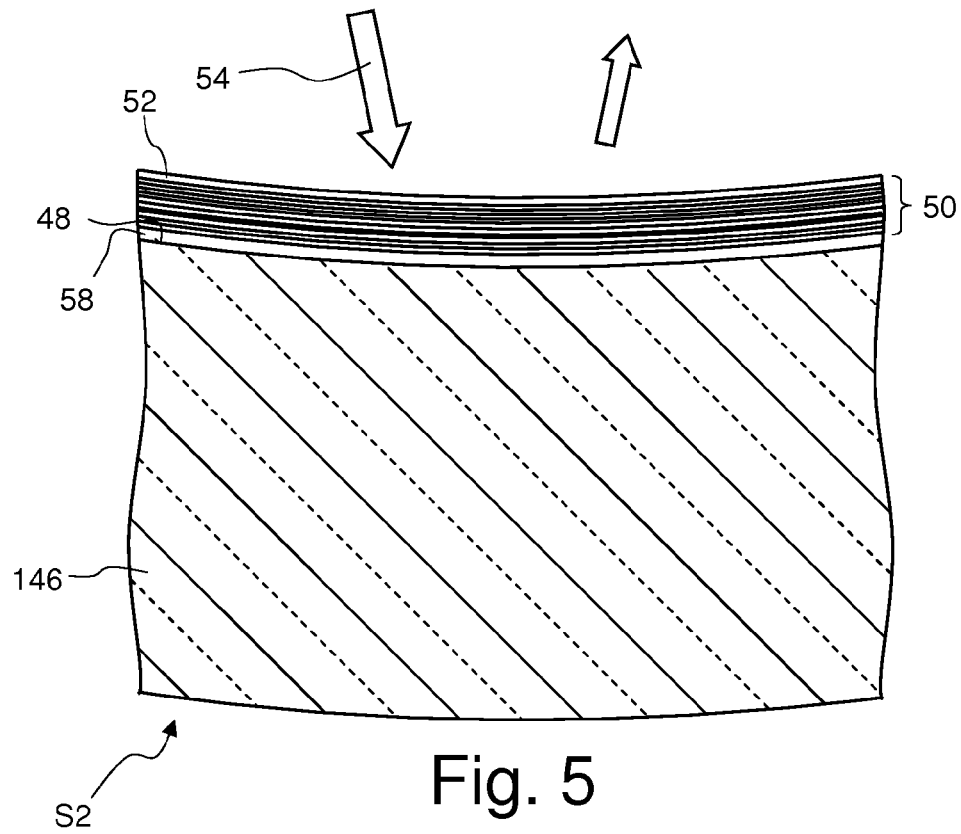
FIG. 5 shows a section through another mirror of the projection objective shown in FIGS. 1 and 2 according to a second exemplary embodiment.

FIG. 5 shows another exemplary embodiment of how a lower susceptibility to compaction of the mirror substrate by EUV light can be achieved. In this exemplary embodiment, the mirror substrate 146 is made of a noncompactable material, for example silicon, silicon carbide, SiSiC, a metal or a metal alloy. In order to improve the polishability of such materials, an additional layer 58 of amorphous quartz glass or aluminium oxide ($Al_2O_3$) is applied on the surface 48 of the mirror substrate 146, as is known per se from U.S. Pat. No. 6,453,005 B2 for mirror substrates made of such materials.

Since these noncompactable materials for the mirror substrate 146 have, however, a relatively high thermal expansion coefficient, measures are implemented so that temperature variations do not lead to an intolerable deformation of the mirror substrate 146. Cooling systems may in particular be envisaged here, which rapidly dissipate the heat generated in the coating 50 and in the mirror substrate 146 by absorption of EUV light. As an alternative or in addition, corrective measures may be carried out in the projection objective by which imaging errors, which are caused by the deformation of the mirror substrate 146, can be corrected.

From the explanations above, it should have become clear that it is desirable to use additional measures, entailing costs, so that the mirror substrates of the mirrors S1 and S3 do not compact. For this reason, it is desirable to implement these measures only on the mirrors for which the risk actually exists that intolerable surface deformations will occur as a result of compaction during the lifetime of the projection objective 10. As already explained, this depends on the total dose of EUV light which has to be dealt with by the mirror substrates during the lifetime of the projection objective 10. It has been found that this total dose depends above all on two factors:

On the one hand, it is important how much light actually still reaches a particular mirror. This amount of light depends above all on the radiation source used and furthermore on how much light has already been absorbed by the preceding mirrors.

On the other hand the radiation dose, to which a volume element of a mirror substrate is exposed during the lifetime of the projection objective 20, depends on the size of the area which is irradiated on the mirror in question. One measure of this is the average subaperture diameter for the mirror in question. For each mirror S1 to S6, each field point can be assigned a subaperture diameter which is equal to the diameter (in the case of noncircular subapertures, the largest diameter) with which a light bundle that comes from the field point strikes the mirror in question. In FIG. 2, for the field point 32, the subaperture diameter is respectively given by the distance between the marginal rays of the light bundle 24 on the individual mirror surfaces. For a particular mirror, the subaperture diameters are not the same for all field points, for which reason it is favourable to work with a subaperture diameter $SA_i$ arithmetically averaged over all the field points. Since the subapertures of the individual field points overlap more or less according to the position of the mirror inside the projection objective, the average subaperture diameter represents a suitable measure of the intensity of the EUV light striking the mirror in question.

With these quantities, for each mirror $S_i$, a threshold value $SA_{th,i}$ for the average subaperture diameter can be specified which is given by Equation (1):

$$SA_{th,i} = k \cdot 0.6^{(i-1)/2} \quad (1)$$

Here, k is a threshold value factor with the units [mm], the value of which may lie between 50 and 200 and which, inter alia, is set as a function of the strength of the EUV light source being used. If, for a particular mirror $S_i$, its average subaperture diameter $SA_i$ lies below the threshold value $SA_{th,i}$ applicable for this mirror, then this mirror is at risk of deforming too greatly by compaction so that the measures explained with the aid of FIGS. 3 and 4 should therefore be implemented. If the average subaperture diameter $SA_i$ lies above the threshold value $SA_{th,i}$ applicable for this mirror, on the other hand, then the mirror can be constructed in the conventional way explained with the aid of FIG. 3.

TABLE 1

| Mirror | Proportion of the light | Subaperture diameter [mm] | Subaperture threshold value [mm] with k = 100 mm | At risk |
|---|---|---|---|---|
| S1 | 100% | 85 | 100 | Yes |
| S2 | 77% | 140 | 77 | No |
| S3 | 60% | 45 | 60 | Yes |
| S4 | 46% | 126 | 46 | No |
| S5 | 36% | 283 | 36 | No |
| S6 | 28% | 675 | 28 | No |

In Table 1, for the mirrors S1 to S6, the threshold values $SA_{th,i}$ are listed for the mirrors S1 to S6 and the average subaperture diameters respectively found for these mirrors are compared. The threshold value factor k was set at k=100 mm. As can be seen, it is only for the mirrors S1 and S3 that the subaperture diameter lies below the threshold value applicable for these mirrors. The additional measures explained above therefore need to be implemented only for the mirrors S1 and S3 in order to avoid intolerable surface deformations due to compaction of the mirror substrate 46 during the lifetime of the projection objective 10.

The corresponding numbers for the projection objective 10 are listed in Table 2, but with the threshold value factor k having been increased from 100 mm to 200 mm. This caters for a hypothetical assumption that a light source with twice the power is used. As may be seen, additional measures in order to reduce the susceptibility to compaction should then also be implemented for the second mirror S2.

TABLE 2

| Mirror | Proportion of the light | Subaperture diameter [mm] | Subaperture threshold value [mm] with k = 200 mm | At risk |
|---|---|---|---|---|
| S1 | 100% | 85 | 200 | Yes |
| S2 | 77% | 140 | 155 | Yes |
| S3 | 60% | 45 | 120 | Yes |
| S4 | 46% | 126 | 93 | No |
| S5 | 36% | 283 | 72 | No |
| S6 | 28% | 675 | 56 | No |

The invention claimed is:
1. A projection objective, comprising:
a first mirror comprising:
  a first mirror substrate; and
  a first reflective coating carried by the first mirror substrate; and
a second mirror comprising:
  a second mirror substrate; and
  a second reflective coating carried by the second mirror substrate,
wherein:
  when irradiated by EUV light having otherwise equal conditions, the first mirror substrate compacts less than the second mirror substrate under an effect of the EUV light,
  a total of M mirrors $S_1, S_2, \ldots, S_M$ are arranged successively in the projection objective;
  m mirrors are first mirrors;
  n=M−m are second mirrors;
  for the m first mirrors, $SA_i < k \cdot 0.6^{(i-1)/2}$;

for the n second mirrors, $SA_i \geq k \cdot 0.6^{(i-1)/2}$;

$SA_i$ is an average subaperture diameter for the $i^{th}$ mirror $M_i$; and k is a threshold value factor of between 50 mm and 200 mm, which is set as a function of a strength of an EUV light source of the projection exposure apparatus, and the projection objective is configured to be used in a microlithographic EUV projection exposure apparatus.

2. The projection objective according to claim 1, wherein $80 < k < 150$.

3. The projection objective according to claim 1, wherein $k = 100$.

4. The projection objective according to claim 1, wherein:
the first mirror substrate comprises a first material;
the second mirror substrate comprises a second material; and
when irradiated with EUV light having otherwise equal conditions, the first material compacts less under an effect of the EUV light than the second material.

5. The projection objective according to claim 4, wherein the first material comprises a material selected from the group consisting of silicon, silicon carbide, SiSiC, a metal, and a metal alloy.

6. The projection objective according to claim 5, further comprising a layer between the first mirror substrate and the first reflective coating, wherein the layer comprises a material selected from the group consisting of $SiO_2$ and $Al_2O_3$.

7. The projection objective according to claim 1, wherein:
the first mirror further comprises a layer having a transmissivity for EUV light that is less than 50%;
the layer is between the first mirror substrate and the first reflective coating.

8. The projection objective according to claim 7, wherein no other mirror in the projection objective comprises a layer between its mirror substrate and its reflective coating, where the layer has a transmissivity for EUV light that is less than 50%.

9. The projection objective according to claim 7, wherein the layer comprises a material selected from the group consisting of a metal and a metal alloy.

10. The projection objective according to claim 1, further comprising a layer between the first mirror substrate and the first reflective coating, wherein the layer comprises a material selected from the group consisting of $SiO_2$ and $Al_2O_3$.

11. An apparatus, comprising:
an illumination system; and
the projection objective according to claim 1,
wherein the apparatus is a microlithography projection exposure apparatus.

12. A projection objective, comprising:
a first mirror comprising:
a first mirror substrate; and
a first reflective coating carried by the first mirror substrate; and
a second mirror comprising:
a second mirror substrate; and
a second reflective coating carried by the second mirror substrate,
a third mirror comprising:
a third mirror substrate; and
a third reflective coating carried by the third mirror substrate,
wherein: when irradiated by EUV light having otherwise equal conditions, the first mirror substrate compacts less than the second mirror substrate under an effect of the EUV light, the third mirror substrate compacts less than the second mirror substrate under the effect of the EUV light, and
the projection objective is configured to be used in a microlithographic EUV projection exposure apparatus.

13. The projection objective according to claim 12, wherein:
the projection objective has a light propagation direction;
the first mirror is before the second mirror along the light propagation direction of the projection objective; and
the second mirror is before the third mirror along the light propagation direction of the projection objective.

14. The projection objective according to claim 13, further comprising fourth, fifth and sixth mirrors.

* * * * *